US012584215B2

(12) United States Patent
Kong et al.

(10) Patent No.: US 12,584,215 B2
(45) Date of Patent: Mar. 24, 2026

(54) APPARATUS FOR MANUFACTURING SEMICONDUCTOR DEVICE

(71) Applicant: Samsung Electronics Co., Ltd., Suwon-si (KR)

(72) Inventors: Byunghwan Kong, Uiwang-si (KR); Hyouncheol Kim, Hwaseong-si (KR); Junseong Park, Seoul (KR); Jaewon Yu, Suwon-si (KR); Hyunju Lee, Seoul (KR); Kwanghyun Jin, Hwaseong-si (KR); Youngmin Ha, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 959 days.

(21) Appl. No.: 17/010,541

(22) Filed: Sep. 2, 2020

(65) Prior Publication Data

US 2021/0062335 A1     Mar. 4, 2021

(30) Foreign Application Priority Data

Sep. 2, 2019     (KR) ........................ 10-2019-0108455

(51) Int. Cl.
 *C23C 16/44* (2006.01)
 *B05B 1/02* (2006.01)
 *H01L 21/67* (2006.01)
(52) U.S. Cl.
 CPC ............ *C23C 16/4405* (2013.01); *B05B 1/02* (2013.01); *H01L 21/67069* (2013.01)
(58) Field of Classification Search
 CPC .. C23C 16/4405; B05B 1/02; H01L 21/67069
 (Continued)

(56) References Cited

U.S. PATENT DOCUMENTS 6,383,300 B1 *  5/2002  Saito ................... C23C 16/4405
                                              118/724
7,534,730 B2 *  5/2009  Ozaki ............... H01L 21/02238
                                              438/770
(Continued)

FOREIGN PATENT DOCUMENTS

JP         2005050856 A      2/2005
KR    1020010066607 A      7/2001
(Continued)

OTHER PUBLICATIONS

Office Action dated Feb. 1, 2024 for corresponding KR Patent Application No. 10-2019-0108455.

(Continued)

*Primary Examiner* — Charlee J. C. Bennett
(74) *Attorney, Agent, or Firm* — Muir Patent Law, PLLC

(57) ABSTRACT

An apparatus for manufacturing a semiconductor device includes a boat configured to support a plurality of stacked substrates, a first tube surrounding the boat in a lateral direction and having a cylindrical shape with an upper portion thereof being open, and a cleaning gas supply nozzle extending from an outer portion of the first tube to a portion between an interior sidewall of the first tube and the boat. The cleaning gas supply nozzle may include a first segment extending from the outer portion of the first tube to an inner portion of the first tube, a second segment extending in a lengthwise direction of the first tube from an end of the first segment, and a third segment extending in a direction differing from the extension direction of the second segment from an end of the second segment.

20 Claims, 12 Drawing Sheets

(58) Field of Classification Search
USPC ................................................... 156/345.33
See application file for complete search history.

(56) References Cited

U.S. PATENT DOCUMENTS

| | | | | | |
|---|---|---|---|---|---|
| 2001/0055738 | A1* | 12/2001 | Takahashi | ........... | C23C 16/4405 |
| | | | | | 432/2 |
| 2007/0062448 | A1* | 3/2007 | Maeda | .............. | C23C 16/45512 |
| | | | | | 118/724 |
| 2008/0038481 | A1* | 2/2008 | West | ..................... | C23C 14/564 |
| | | | | | 427/580 |
| 2009/0221149 | A1* | 9/2009 | Hammond, IV | .. | H01J 37/32449 |
| | | | | | 156/345.33 |
| 2011/0074869 | A1* | 3/2011 | Kanata | ................. | B41J 2/16552 |
| | | | | | 347/25 |
| 2012/0247670 | A1* | 10/2012 | Dobashi | ............ | H01L 21/67028 |
| | | | | | 156/345.31 |
| 2014/0014589 | A1* | 1/2014 | Niskakangas | ......... | E21B 21/065 |
| | | | | | 210/201 |
| 2014/0345801 | A1* | 11/2014 | Yang | ................. | H01L 21/67757 |
| | | | | | 118/712 |
| 2016/0033399 | A1* | 2/2016 | Klassen | ................. | G01N 21/01 |
| | | | | | 356/243.4 |
| 2016/0168704 | A1* | 6/2016 | Choi | ................. | C23C 16/45546 |
| | | | | | 156/345.33 |
| 2017/0333958 | A1* | 11/2017 | Mizota | .............. | H01L 21/67051 |
| 2018/0025926 | A1 | 1/2018 | Kim et al. | | |
| 2018/0353980 | A1 | 12/2018 | Rijn et al. | | |
| 2020/0073258 | A1* | 3/2020 | Chiu | ................... | G03F 7/70725 |
| 2021/0062335 | A1* | 3/2021 | Kong | ............... | C23C 16/45578 |
| 2022/0411933 | A1* | 12/2022 | Takamura | ......... | C23C 16/45578 |

FOREIGN PATENT DOCUMENTS

| | | | | | |
|---|---|---|---|---|---|
| KR | 1020060032914 | A | | 4/2006 | |
| KR | 100858511 | B1 | | 9/2008 | |
| KR | 1020100071604 | A | | 6/2010 | |
| KR | 1020100088425 | B1 | | 8/2010 | |
| KR | 101139821 | B1 | | 4/2012 | |
| KR | 20180009853 | A | * | 1/2018 | |
| KR | 1020180009853 | A | | 1/2018 | |
| KR | 101824628 | B1 | | 2/2018 | |

OTHER PUBLICATIONS

Notice of Allowance dated Jun. 27, 2024, for corresponding KR Patent Application No. 10-2019-0108455.

* cited by examiner

APPARATUS FOR MANUFACTURING SEMICONDUCTOR DEVICE

CROSS-REFERENCE TO RELATED APPLICATION

This application claims priority to Korean Patent Application No. 10-2019-0108455, filed on Sep. 2, 2019, in the Korean Intellectual Property Office, the disclosure of which is incorporated herein in its entirety by reference.

BACKGROUND

The inventive concept relates to an apparatus for manufacturing a semiconductor device, and more particularly, to an apparatus for manufacturing a semiconductor device, which achieves uniform deposition, decreases the occurrence of particles, and reduces manufacturing costs.

In a process chamber for depositing a material layer on a substrate, when the material layer is deposited on an inner wall of the process chamber and a thickness thereof increases to be greater than a certain-level thickness, the material layer on the inner wall may act as a source of particles which pollute the substrate, and thus, it is beneficial to develop a method of preventing and/or suppressing the inner wall from being polluted by the material layer.

SUMMARY

The inventive concept provides an apparatus for manufacturing a semiconductor device, which achieves uniform deposition, decreases the occurrence of particles, and reduces manufacturing costs.

According to an aspect of the inventive concept, there is provided an apparatus for manufacturing a semiconductor device. The apparatus may include a boat configured to support a plurality of stacked substrates, a first tube surrounding the boat in a lateral direction and having a cylindrical shape with an upper portion thereof being open, and a cleaning gas supply nozzle extending from an outer portion of the first tube to a portion between an interior sidewall of the first tube and the boat. The cleaning gas supply nozzle may include a first segment extending from the outer portion of the first tube to an inner portion of the first tube, a second segment extending in a lengthwise direction of the first tube from an end of the first segment, and a third segment extending in a direction differing from the extension direction of the second segment from an end of the second segment.

According to another aspect of the inventive concept, there is provided an apparatus for manufacturing a semiconductor device. The apparatus may include a boat configured to support a plurality of substrates stacked at certain intervals, a first tube surrounding the boat in a lateral direction and having a cylindrical shape with an upper portion thereof being open, and a second tube surrounding the first tube in a lateral direction and comprising a closed upper portion. The device may further include a manifold provided under the second tube, a lid member provided under the manifold, a rotation driving unit configured to rotate the boat, and a vertical driving unit configured to raise and lower the boat. The device may further include a first cleaning gas supply nozzle passing through the manifold, extending in a horizontal direction from an outer portion of the second tube, and extending in a vertical direction between an interior sidewall of the first tube and the boat.

The first cleaning gas supply nozzle may be configured to emit a cleaning gas at an oblique angle with respect to the vertical direction.

According to another aspect of the inventive concept, there is provided an apparatus for manufacturing a semiconductor device. The apparatus may include a tube accommodating a plurality of substrates and providing a deposition space, a material layer deposited on an inner wall of the tube and having a thickness within a first thickness range, and a cleaning gas supply nozzle configured to partially remove the material layer and maintain the thickness of the material layer within the first thickness range. The cleaning gas supply nozzle may be configured to emit a cleaning gas to flow spirally along the inner wall of the tube on the basis of a Coanda effect.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments will be described in detail with reference to the accompanying drawings. Like numeral references refer to like elements, and their repetitive descriptions are omitted.

Figure 1:
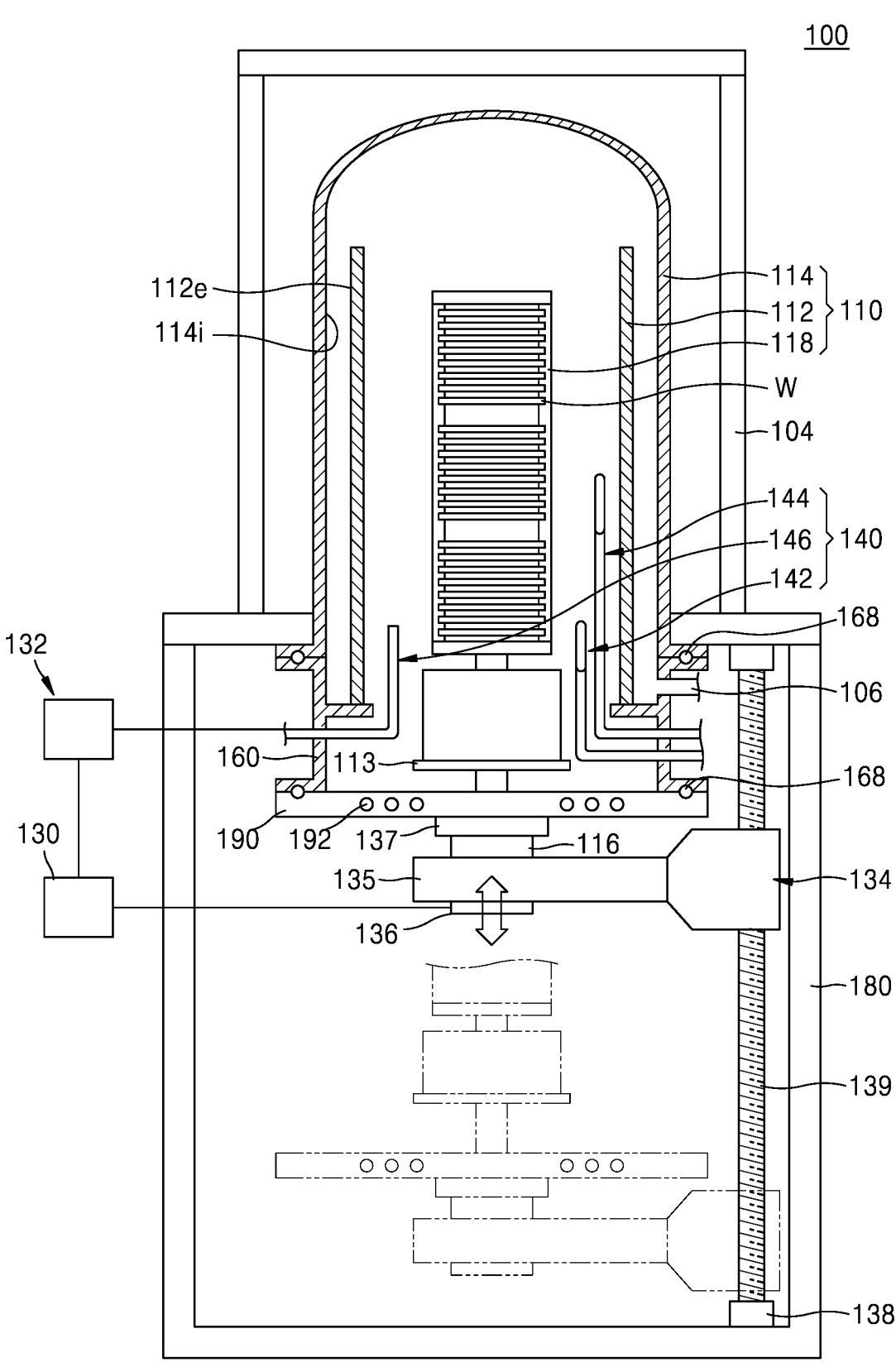
FIG. 1 is a side view illustrating an apparatus for manufacturing a semiconductor device, according to an embodiment.

FIG. 1 is a side view illustrating an apparatus 100 for manufacturing a semiconductor device according to an embodiment.

Referring to FIG. 1, the apparatus 100 for manufacturing a semiconductor device may include a process chamber 110, a heating unit 104 surrounding the process chamber 110, and a nozzle unit 140.

The process chamber 110 may include a first tube 112, a second tube 114, and a boat 118. Boat 118 may be, e.g., a ceramic holder or the like configured to hold a substrate W.

The first tube 112 may have, for example, a cylindrical shape which extends in a vertical direction and where an upper end and a lower end thereof are opened, and the boat 118 may be accommodated in and be surrounded by the first tube 112. In some embodiments, the upper end of the first tube 112 may be closed. A plurality of substrates W may be stacked on the boat 118. The first tube 112 may include a material such as quartz or silicon carbide (SiC) which can endure a relatively high temperature.

The second tube 114 may have, for example, a cylindrical shape which extends in a vertical direction and where an upper portion thereof has a dome shape and a lower portion thereof is opened. The second tube 114 may surround the first tube 112 in a lateral direction. Therefore, an internal diameter of the second tube 114 may be greater than an external diameter of the first tube 112. Also, an outer surface 112e of the first tube 112 may be spaced apart from an inner surface 114i of the second tube 114. The second tube 114 may include a material such as quartz or SiC which can endure a relatively high temperature.

The heating unit 104 for heating the process chamber 110 may be provided outside the process chamber 110 in the lateral direction. The heating unit 104 may surround the process chamber 110 in the lateral direction. In some embodiments, the heating unit 104 may be configured to cover an upper portion of the process chamber 110.

A manifold 160 may be provided under the process chamber 110. The manifold 160 may be coupled to a lower portion of the process chamber 110. In detail, the manifold 160 may be disposed under the second tube 114 concentrically with the second tube 114. The manifold 160 may have a cylindrical shape where an upper end and a lower end thereof are opened and may include metal (for example, steel), but is not limited thereto.

An exhaust unit 106 for exhausting a surplus source gas, a purge gas, and a reactant byproduct may be provided at one side of the manifold 160. The exhaust unit 106 may be connected to a vacuum pump for vacuum-exhausting the process chamber 110.

The boat 118 may accommodate a plurality of substrates W stacked at certain intervals in a vertical direction. The boat 118 may be loaded into the process chamber 110 by a vertical driving unit 134, or may be unloaded from the process chamber 110. The substrates W may be accommodated into the boat 118 and may be loaded into the process chamber 110, and then, a lower opening of the manifold 160 may be closed by a lid member 190. An internal space of the manifold 160 may be provided to have a temperature which is relatively lower than that of an internal space of the process chamber 110. In order to compensate for such a temperature difference, a heater 192 may be included in the lid member 190. That is, the heater 192 may heat the inside of the manifold 160, and thus, may enable an internal temperature distribution of each of the process chamber 110 and the manifold 160 to be uniform. The heater 192 may use, for example, an electric resistance heating wire.

A plurality of seal members 168 for providing a seal may be disposed between the process chamber 110 and the manifold 160 and between the manifold 160 and the lid member 190.

The nozzle unit 140 may supply the process chamber 110 with source gases for forming thin films on the substrates W, a purge gas for purging the inside of the process chamber 110, and a cleaning gas for cleaning the inside of the process chamber 110, and dedicated nozzles for the gases may be provided. In some embodiments, two or more kinds of gases among the gases may be supplied through one nozzle.

In some embodiments, the nozzle unit 140 may include a first cleaning gas supply nozzle 142, a second cleaning gas supply nozzle 144, and a process gas supply nozzle 146. Each of the first cleaning gas supply nozzle 142 and the second cleaning gas supply nozzle 144 may be configured to supply the cleaning gas. The cleaning gas may be a cleaning gas for removing a material layer deposited on an inner surface of the first tube 112, and for example, may be a halogen-containing etching gas. In some embodiments, the cleaning gas may be a fluorocarbon such as $CF_4$, $ClF_3$, $Cl_2F_2$, $Cl_3F$, $CClF_3$, $CCl_2F_2$, $CCl_3F$, $C_2F_4$, $C_2F_6$, or $C_3F_8$, but is not limited thereto.

The process gas supply nozzle 146 may supply a gas for processing the substrates W.

The nozzle unit 140 may include a material such as quartz or silicon carbide SiC which can endure a relatively high temperature.

The gas supply unit 132 may include a plurality of storages which are disposed to be connected to the nozzle unit 140 and store the source gases (or a liquid source material), the purge gas, and the cleaning gas, a vaporizer which vaporizes the liquid source material, and a valve which controls the amount of each of the supplied gases. Although the gas supply unit 132 is illustrated as being connected to some gas supply nozzles in FIG. 1, the gas supply unit 132 may be connected to all gas supply nozzles.

The controller 130 may control operations of the gas supply unit 132, the vertical driving unit 134, and a rotation driving unit 136. In detail, the controller 130 may control a flow rate and a supply time of each of the gases supplied from the gas supply unit 132 (after the boat 118 with the plurality of substrates W stacked thereon is loaded into the process chamber 110 by the vertical driving unit 134) and may control a rotation speed of each of the substrates W rotated by the rotation driving unit 136 so as to form a thin film having a uniform thickness on each of the substrates W. The term "controller" is meant to be used in its broadest sense to include one or more controllers, computers and/or microprocessors, and/or other computer hardware, and/or software, and/or computer implemented algorithms that may be associated with the gas supply unit 132, vertical driving unit 134, and rotation driving unit 136, e.g., and may cooperate in controlling the various functions and operations thereof described herein.

The vertical driving unit 134 may include a horizontal arm 135, a vertical driver 138 which provides a driving force for moving the horizontal arm 135 in a vertical direction, and a driving shaft 139 for transferring the driving force. The vertical driver 138 may include a motor, e.g., a first motor. The driving shaft 139 may use a lead screw which rotates with a rotational force provided from the first motor. The horizontal arm 135 may be coupled to the driving shaft 139 and may move in a vertical direction on the basis of a rotation of the driving shaft 139.

The boat 118 may be disposed on a turntable 113, and the turntable 113 may be coupled to an upper portion of the rotational shaft 116. The rotational shaft 116 may be connected to the turntable 113 and the rotation driving unit 136. The rotation driving unit 136 may be disposed under the horizontal arm 135 of the vertical driving unit 134, and the lid member 190 may be disposed on the horizontal arm 135 of the vertical driving unit 134. The rotation driving unit 136 may include a motor, e.g., a second motor. A rotational force provided from the second motor may be transferred to the rotational shaft 116. The rotation driving unit 136 may rotate the turntable 113 and the boat 118. A mechanical seal 137 for preventing leakage through a gap between the rotational shaft 116 and the lid member 190 may be disposed between the lid member 190 and the horizontal arm 135.

The apparatus 100 for manufacturing a semiconductor device according to an embodiment may further include a load lock chamber 180. The load lock chamber 180 may include a load port which is disposed under the manifold 160 and through which the substrates W are loaded.

Figure 2:
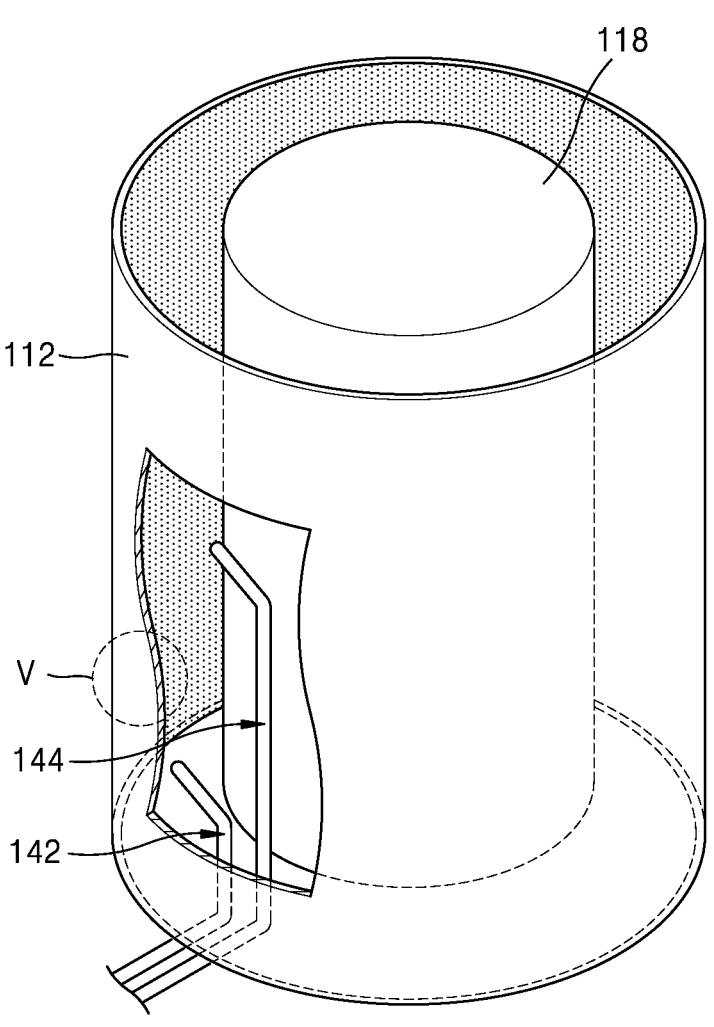
FIG. 2 is a perspective view illustrating a position relationship between a first tube, a boat, a first cleaning gas supply nozzle, and a second cleaning gas supply nozzle of an apparatus for manufacturing a semiconductor device, according to an embodiment.
Figure 3:
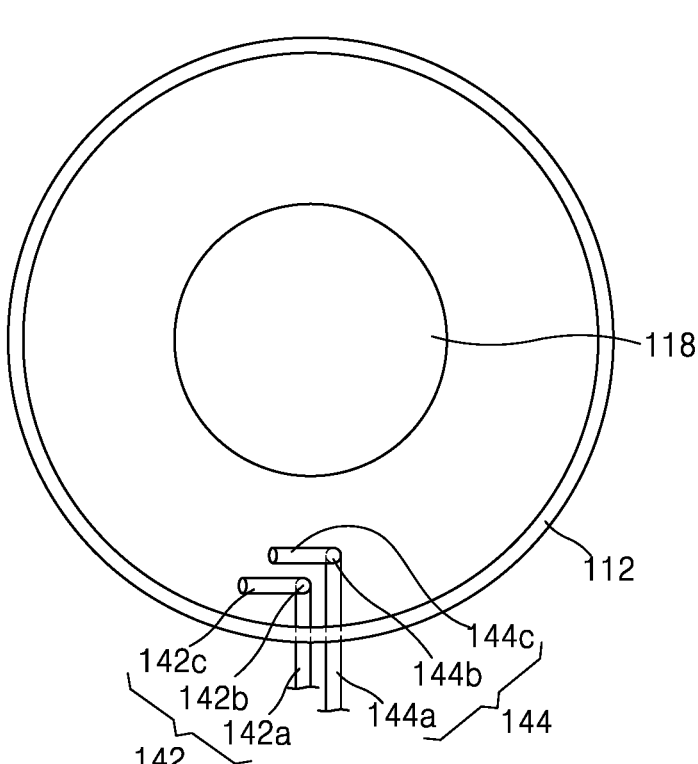
FIG. 3 is a plan view illustrating a position relationship between the first tube, the boat, the first cleaning gas supply nozzle, and the second cleaning gas supply nozzle, according to the embodiment of FIG. 2.

FIG. 2 is a perspective view illustrating a position relationship between a first tube 112, a boat 118, a first cleaning gas supply nozzle 142, and a second cleaning gas supply nozzle 144 of an apparatus 100 for manufacturing a semiconductor device according to an embodiment. FIG. 3 is a plan view illustrating a position relationship between the elements illustrated in FIG. 2.

Referring to FIGS. 2 and 3, the first cleaning gas supply nozzle 142 and the second cleaning gas supply nozzle 144 may pass through a lower end of the first tube 112 and may extend from the outside of the first tube 112 to the inside of the first tube 112. Subsequently, the first cleaning gas supply nozzle 142 and the second cleaning gas supply nozzle 144 may vertically extend in a lengthwise direction of the first tube 112 between the first tube 112 and the boat 118. In FIG. 2, the illustration of a substrate is omitted, and the boat 118 is briefly illustrated as a cylinder.

Subsequently, the first cleaning gas supply nozzle 142 and the second cleaning gas supply nozzle 144 may extend by a certain distance at an oblique angle with respect to the lengthwise direction of the first tube 112. The first cleaning gas supply nozzle 142 and the second cleaning gas supply nozzle 144 may vertically extend to positions corresponding to different heights, e.g., in sideview, the nozzle tip portions (end portions) of each of nozzles 142, 144 may extend to respective positions at different heights from a lowermost portion of the first tube 112.

An end portion of the first cleaning gas supply nozzle 142 (i.e., a nozzle tip through which a cleaning gas is discharged) may be disposed at a lower end of a portion, on which a substrate is stacked, of the boat 118 or at a level which is lower than the lower end of the boat 118. In some embodiments, the nozzle tip of the first cleaning gas supply nozzle 142 may be disposed near the lower end of the boat 118.

An end portion of the second cleaning gas supply nozzle 144 (i.e., a nozzle tip through which the cleaning gas is discharged) may be disposed near a center portion of the boat 118 in a vertical direction. In some embodiments, the nozzle tip of the second cleaning gas supply nozzle 144 may be disposed within a range corresponding to about 40% to about 60% of a vertical dimension (vertical length) of the boat 118 from the lower end of the boat 118. Terms such as "about" may reflect amounts or orientations that vary only in a small relative manner, and/or in a way that does not significantly alter the operation, functionality, or structure of certain elements. For example, a range from "about 40% to about 60%" may encompass a range having a deviation of 0%-5% deviation, especially if such deviation maintains the same effect as the listed range.

Figure 4:
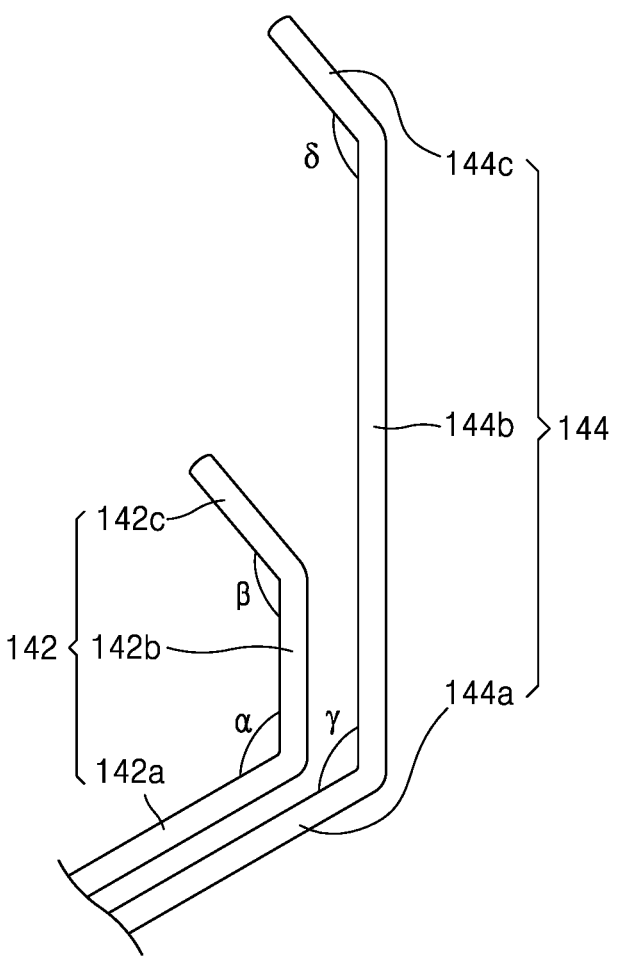
FIG. 4 is a perspective view illustrating in detail a configuration of each of the first cleaning gas supply nozzle and the second cleaning gas supply nozzle.

FIG. 4 is a perspective view illustrating in detail a configuration of each of the first cleaning gas supply nozzle 142 and the second cleaning gas supply nozzle 144.

Referring to FIG. 4, the first cleaning gas supply nozzle 142 may include a first segment 142a, a second segment 142b, and a third segment 142c which are sequentially connected to one another. In some embodiments, the first segment 142a may extend from an outer portion of the first tube 112 to an inner portion of the first tube 112 at a portion under a lower end of the first tube 112. In some embodiments, the first segment 142a may pass through the first tube 112 and may extend from the outer portion of the first tube 112 to the inner portion of the first tube 112.

The second segment 142b may extend by a certain height in a lengthwise direction of the first tube 112 from an end of the first segment 142a. The second segment 142b may have a first angle "α" with respect to the first segment 142a. The first angle "α" may be about 80 degrees to about 100 degrees, about 85 degrees to about 95 degrees, or about 90 degrees.

The third segment 142c may extend at a certain angle in a direction differing from an extension direction of the second segment 142b from an end of the second segment 142b. The third segment 142c may have a second angle "β" with respect to the second segment 142b. The second angle "β" may be an acute angle, a right angle, or an obtuse angle. The second angle "β" may be about 60 degrees to about 150 degrees, about 65 degrees to about 145 degrees, about 70 degrees to about 140 degrees, about 75 degrees to about 135 degrees, about 80 degrees to about 130 degrees, about 85 degrees to about 125 degrees, about 90 degrees to about 120 degrees, about 100 degrees to about 120 degrees, or about 105 degrees to about 120 degrees. However, the inventive concept is not limited to the specific ranges recited herein.

The second angle "β" may be determined based on various conditions. The second angle "β" may be determined based on the kind of material layer deposited on an inner wall of the first tube 112 and on the kind of cleaning gas for partially removing the material layer.

In some embodiments, the third segment 142c may be configured to enable the second angle "β" to be adjustable and controlled. For example, the second angle "β" may be controlled by bending a connection portion between the third segment 142c and the second segment 142b. In this manner, the first cleaning gas supply nozzle 142 may be a flexible, bendable nozzle, and may be adjusted by a user for optimal performance.

In some embodiments, when the deposited material layer is polysilicon and $CIF_3$ is used as the cleaning gas, the second angle "β" may be about 110 degrees.

The second cleaning gas supply nozzle 144 may include a fourth segment 144a, a fifth segment 144b, and a sixth segment 144c which are sequentially connected to one another. In some embodiments, the fourth segment 144a may extend from the outer portion of the first tube 112 to the inner portion of the first tube 112 at a portion under the lower end of the first tube 112. In some embodiments, the fourth segment 144a may pass through the first tube 112 and may extend from the outer portion of the first tube 112 to the inner portion of the first tube 112.

The fifth segment 144b may extend by a certain height in the lengthwise direction of the first tube 112 from an end of the fourth segment 144a. The fifth segment 144b may have a third angle "γ" with respect to the fourth segment 144a. The third angle "γ" may be about 80 degrees to about 100 degrees, about 85 degrees to about 95 degrees, or about 90 degrees.

A length of the fifth segment 144b may be greater than that of the second segment 142b. The length of the fifth segment 144b may be determined so that a nozzle tip of the second cleaning gas supply nozzle 144 is disposed at a desired level.

The sixth segment 144c may extend at a certain angle in a direction differing from an extension direction of the fifth segment 144b from an end of the fifth segment 144b. The sixth segment 144c may have a fourth angle "δ" with respect to the fifth segment 144b. The fourth angle "δ" may be an acute angle, a right angle, or an obtuse angle. The fourth angle "δ" may be about 60 degrees to about 150 degrees, about 65 degrees to about 145 degrees, about 70 degrees to about 140 degrees, about 75 degrees to about 135 degrees, about 80 degrees to about 130 degrees, about 85 degrees to about 125 degrees, about 90 degrees to about 120 degrees, about 100 degrees to about 120 degrees, or about 105 degrees to about 120 degrees. However, the inventive concept is not limited to the specific ranges recited herein.

The fourth angle "δ" may be determined based on various conditions as disclosed above with respect to the second angle "β". In some embodiments, the fourth angle "δ" may be determined to be equal to the second angle "β".

Referring again to FIGS. 2 and 3, the third segment 142c of the first cleaning gas supply nozzle 142 may be oriented so that the cleaning gas emitted therefrom moves spirally while rotating along an inner sidewall of the first tube 112. That is, the emitted cleaning gas may spirally flow while rotating and rising along the inner sidewall of the first tube 112, and based on such a flow, the cleaning gas may react with the material layer which contacts the inner sidewall of the first tube 112 and is deposited on the inner wall of the first tube 112, thereby removing the material layer. A process of removing the material layer may be a dry cleaning reaction which does not use plasma, and for example, when the material layer is polysilicon, the material layer may be removed based on the following reaction formula.

$$Si+4F \rightarrow SiF_4$$

Here, fluorine is described as a reactant which reacts with a silicon atom, but the reactant may be any halogen element. A supply source for the halogen element may be, for example, $CF_4$, $ClF_3$, $Cl_2F_2$, $Cl_3F$, $CClF_3$, $CCl_2F_2$, $CCl_3F$, $C_2F_4$, $C_2F_6$, and $C_3F_8$, but the inventive concept is not limited thereto.

Also, Coanda effect may be facilitated so that the emitted cleaning gas flows along the inner sidewall of the first tube 112. The Coanda effect refers to a phenomenon where a fluid moving along a proximity of a wall surface is attached on the wall surface and flows along the wall surface. That is, as a fluid moves along a wall surface, a region having low pressure lower than peripheral pressure may be formed along the wall surface, and thus, the peripheral pressure may be applied to the region having the low pressure, whereby the fluid may flow along the wall surface. Since the cleaning gas flows along a wall surface, the material layer may be uniformly removed from the whole inner sidewall of the first tube 112.

To this end, the third segment 142c may not be oriented toward a center of the first tube 112 and may be oriented to be approximately parallel to a corresponding section of the inner sidewall of the first tube 112. In some embodiments, the third segment 142c may be oriented so that a distance between a nozzle tip and the inner sidewall of the first tube 112 is about 80% to about 120% of a distance between the second segment 142b and the inner sidewall of the first tube 112.

The sixth segment 144c of the second cleaning gas supply nozzle 144 may be oriented similar to the third segment 142c of the first cleaning gas supply nozzle 142. That is, the sixth segment 144c of the second cleaning gas supply nozzle 144 may be oriented so that the cleaning gas emitted therefrom flows spirally while rotating along the inner sidewall of the first tube 112, and for example, may be oriented so that a distance between a nozzle tip and the inner sidewall of the first tube 112 is about 80% to about 120% of a distance between the fifth segment 144b and the inner sidewall of the first tube 112.

A flow condition may be determined so that the cleaning gas emitted from the nozzle tip of each of the first and second cleaning gas supply nozzles 142 and 144 has a laminar flow. For example, a flow speed, a nozzle tip dimension, and an in-tube density of the cleaning gas emitted from the nozzle tip may be controlled so that the cleaning gas has a Reynolds number of about 10 to about 2,100. For example, when the Reynolds number of the cleaning gas emitted from the nozzle tip is excessively large or small, the above-described Coanda effect may not effectively occur. Particularly, when the Reynolds number of the cleaning gas emitted from the nozzle tip is excessively small, a flow speed may be very low, and due to this, a long time may be taken in removing the material layer.

When the material layer of the inner wall of the first tube 112 is removed by a wet process, the material layer deposited on the inner wall of the first tube 112 may be cleaned by immersing the first tube into a cleaning solution, and due to this, a long time may be taken in maintenance. Also, even when the material layer of the inner wall of the first tube 112 is removed by a dry etching process, with a nozzle for supplying the cleaning gas having the same shape as that of the first segment 142a of the first cleaning gas supply nozzle 142 or having a shape where the first segment 142a is coupled to the second segment 142b, it may be difficult to uniformly remove the material layer of the inner wall of the first tube 112.

The inventors have implemented a shape of the first cleaning gas supply nozzle 142 and/or the second cleaning gas supply nozzle 144 as illustrated in FIGS. 2 to 4, and thus, have recognized that the material layer of the inner wall of the first tube 112 is uniformly removed. Moreover, the inventors have recognized that a better deposition environment is secured by maintaining and managing the material layer of the inner wall of the first tube 112 within a certain range rather than removing all of the material layer. This will be described below in more detail.

Figure 5:
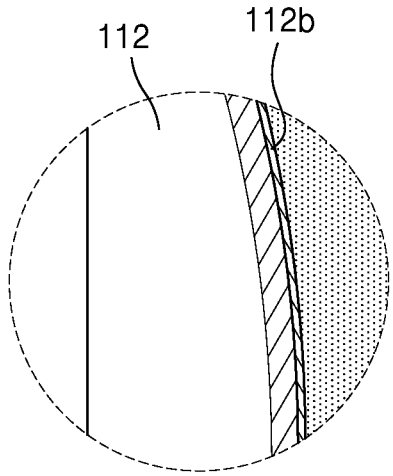
FIG. 5 is a partial cross-sectional view illustrating a cross-sectional surface of a first tube according to an embodiment.

FIG. 5 is a partial cross-sectional view illustrating a cross-sectional surface of a first tube 112 according to an embodiment.

Referring to FIG. 5, a material layer 112b may be deposited on an inner surface of the first tube 112. The material layer 112b may be the same as a material layer which is to subsequently be deposited on the substrate W. For example, when a material which to be deposited on the substrate W is polysilicon, the material layer 112b may be polysilicon. In another embodiment, when a material which to be deposited on the substrate W is another material, the material layer 112b may be a film including the other material.

The material layer 112b may have substantially a certain thickness on the inner surface of the first tube 112. A thickness of the material layer 112b may be about 2.5 μm to about 6.5 μm or about 3 μm to about 6 μm. In some embodiments, the material layer 112b may have a thickness which is slightly greater at a lower end of the first tube 112 than an upper end of the first tube 112. This will be described below in more detail.

Figure 6:
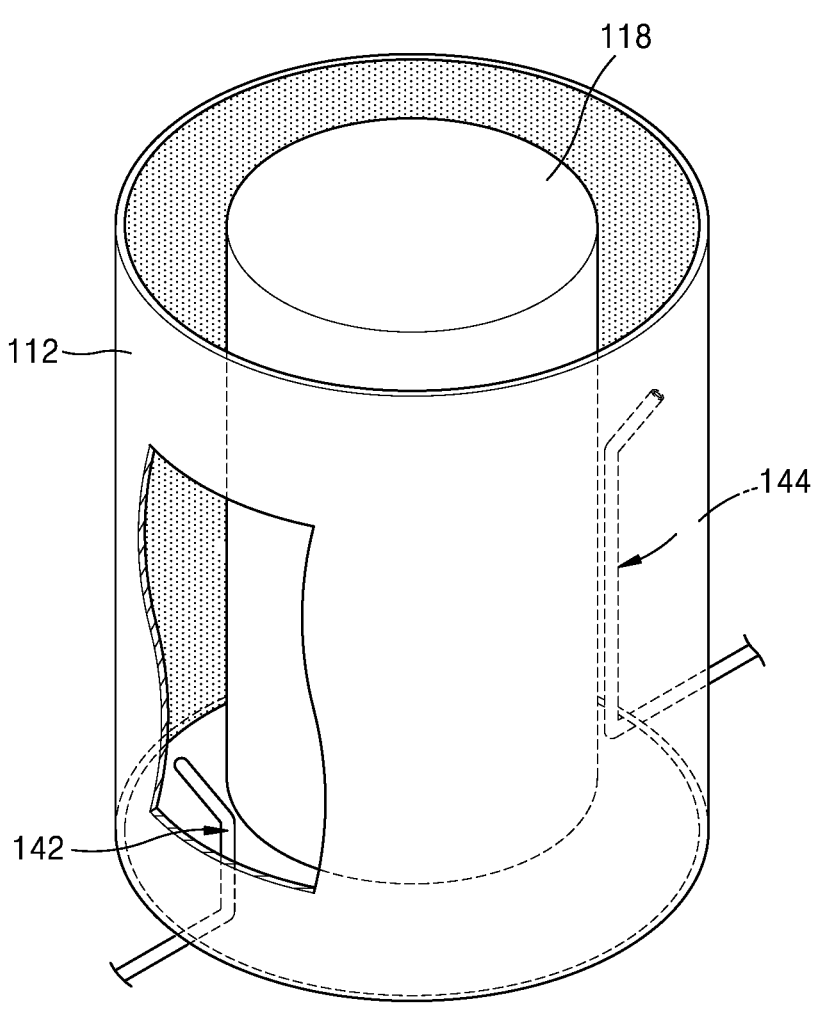
FIG. 6 is a perspective view illustrating a position relationship between a first tube, a boat, a first cleaning gas supply nozzle, and a second cleaning gas supply nozzle of an apparatus for manufacturing a semiconductor device, according to another embodiment.
Figure 7:
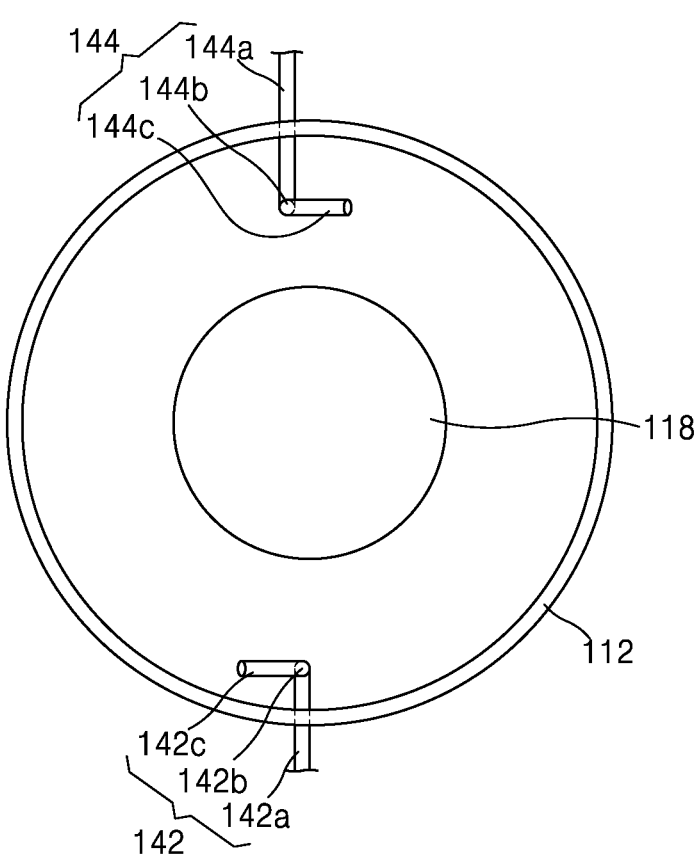
FIG. 7 is a plan view illustrating a position relationship between the first tube, the boat, the first cleaning gas supply nozzle, and the second cleaning gas supply nozzle, according to the embodiment of FIG. 6.

FIG. 6 is a perspective view illustrating a position relationship between a first tube 112, a boat 118, a first cleaning gas supply nozzle 142, and a second cleaning gas supply nozzle 144 of an apparatus 100 for manufacturing a semiconductor device according to an embodiment. FIG. 7 is a plan view illustrating a position relationship between the elements.

Referring to FIGS. 6 and 7, the first cleaning gas supply nozzle 142 and the second cleaning gas supply nozzle 144 may be disposed at positions opposite to each other with respect to the boat 118. The first cleaning gas supply nozzle 142 may be disposed at one side of the boat 118, and the second cleaning gas supply nozzle 144 may be disposed at the other side of the boat 118. A third segment 142c of the first cleaning gas supply nozzle 142 and a sixth segment 144c of the second cleaning gas supply nozzle 144 may be oriented so that a cleaning gas emitted from each of the third and sixth segments 142c and 144c flows in a clockwise direction of FIG. 7. In another embodiment, each of the third segment 142c and the sixth segment 144c may be oriented so that the cleaning gas emitted therefrom flows in a counterclockwise direction of FIG. 7.

A level and an orientation direction of each of the third segment 142c and the sixth segment 144c have been described above with reference to FIGS. 2 to 4, and thus, their detailed descriptions are omitted.

Figure 8:
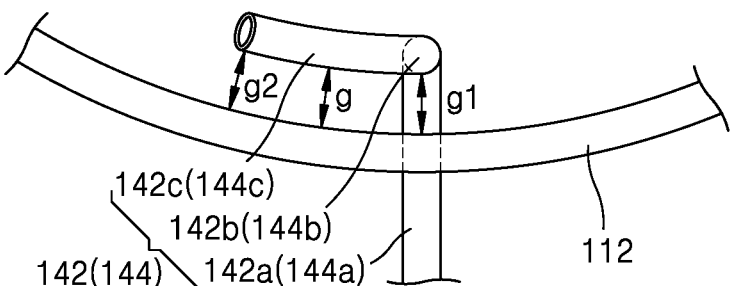
FIG. 8 is a plan view illustrating a third segment (or a sixth segment) according to another embodiment.

FIG. 8 is a plan view illustrating a third segment 142c (or a sixth segment 144c) according to another embodiment. When seen from above, the third segment 142c (or the sixth segment 144c) illustrated in FIG. 8 may have a curved shape, and thus, may differ from the third segments 142c (or the sixth segments 144c) illustrated in FIGS. 3 and 7. Hereinafter, therefore, such a difference will be described.

Referring to FIG. 8, the third segment 142c (or the sixth segment 144c) may be configured to form a curve when being projected onto a plane including a lower end of a first tube 112. That is, the projected third segment 142c (or the projected sixth segment 144c) may form a curve having a profile which is convex toward the first tube 112 along an inner surface of the first tube 112. In some embodiments, a curvature center of the projected third segment 142c (or the projected sixth segment 144c) may be substantially the same as that of the first tube 112.

In some embodiments, a distance g between the third segment 142c (or the sixth segment 144c) and the inner surface of the first tube 112 may be maintained to be substantially constant over a total length of the third segment 142c (or the sixth segment 144c). For example, the third segment 142c may have a curved profile which uniformly follows the extent of the curved profile of first tube 112.

In some embodiments, a distance g1 between a second segment 142b (or a fifth segment 144b) and the inner surface of the first tube 112 may be substantially the same as a distance g2 between a nozzle tip of the third segment 142c (or the sixth segment 144c) and the inner surface of the first tube 112.

Figure 9:
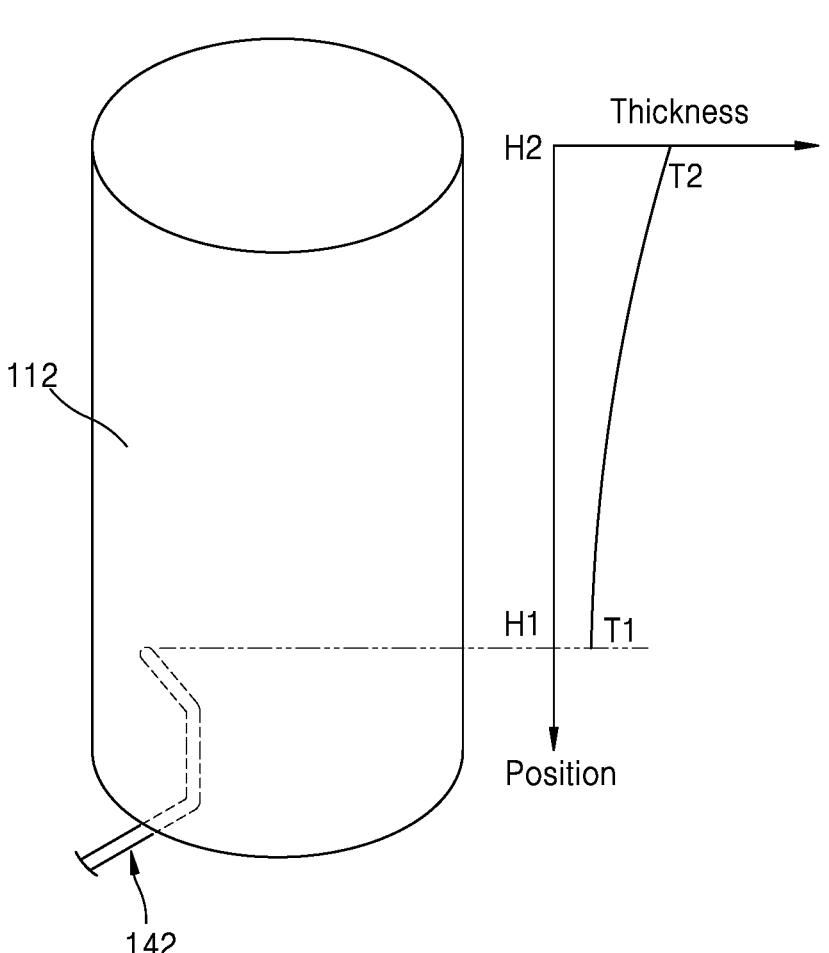
FIG. 9 is a schematic view conceptually illustrating a variation of a thickness of a material layer with respect to a position when an inner surface of a first tube is cleaned by a first cleaning gas supply nozzle.

FIG. 9 is a schematic view conceptually illustrating a variation of a thickness of a material layer 112n (see FIG. 5)

with respect to a position when an inner surface of a first tube 12 is cleaned by a first cleaning gas supply nozzle 142.

Referring to FIG. 9, a level of a nozzle tip of the first cleaning gas supply nozzle 142 may be defined as a first height H1, and an upper end of the first tube 112 may be defined as a second height H2. In some embodiments, the first height H1 and second height H2 may each be measured from a lowermost portion of first tube 112. A thickness of the material layer 112b may increase in a direction from the first height H1 to the second height H2. The material layer 112b may have a first thickness T1 at the first height H1 and may have a second thickness T2 greater than the first thickness T1 at the second height H2.

The material layer 112b may be relatively more removed near the first height H1 close to the nozzle tip from which a cleaning gas for partially removing the material layer 112b is emitted, and thus, a thickness of the material layer 112b may be relatively less. In the whole material layer 112b, a variation degree of a minimum thickness with respect to a maximum thickness may be equal to or less than about 10%, about 5%, or about 3%.

Figure 10:
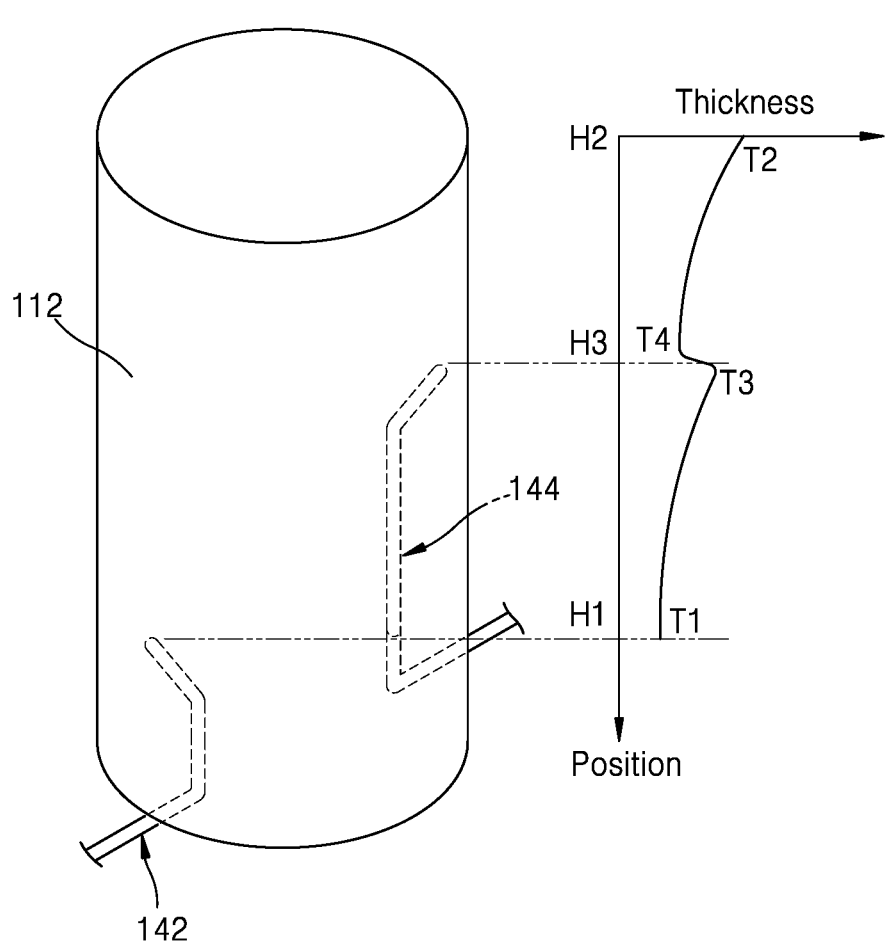
FIG. 10 is a schematic view conceptually illustrating a variation of a thickness of a material layer with respect to a position when an inner surface of a first tube is cleaned by a first cleaning gas supply nozzle and a second cleaning gas supply nozzle.

FIG. 10 is a schematic view conceptually illustrating a variation of a thickness of a material layer 112b (see FIG. 5) with respect to a position when an inner surface of a first tube 112 is cleaned by a first cleaning gas supply nozzle 142 and a second cleaning gas supply nozzle 144.

Referring to FIG. 10, a level of a nozzle tip of the first cleaning gas supply nozzle 142 may be defined as a first height H1, and an upper end of the first tube 112 may be defined as a second height H2. Also, a level of a nozzle tip of the second cleaning gas supply nozzle 144 may be defined as a third height H3. That is, the third height H3 may be between the first height H1 and the second height H2. In some embodiments, the first height H1, second height H2, and third height H3 may each be measured from a lowermost portion of first tube 112.

A thickness of the material layer 112b may increase in a direction from the first height H1 to the third height H3. The material layer 112b may have a first thickness T1 at the first height H1 and may have a third thickness T3 greater than the first thickness T1 in proximity to the third height H3. A thickness of the material layer 112b may decrease to a fourth thickness T4 less than the third thickness T3 near the third height H3 and may increase to a second thickness T2 greater than the fourth thickness T4 at the second height H2. Although it is illustrated in FIG. 10 that a thickness of the material layer 112b sharply varies from the third thickness T3 to the fourth thickness T4 near the height H2, a thickness of the material layer 112b may vary gently. However, a thickness of the material layer 112b may have at least one peak (where the peak may be a portion corresponding to the third thickness T3) without monotonically varying between the first height H1 and the second height H2.

In a portion near the first and third heights H1 and H3 close to the nozzle tip from which a cleaning gas for partially removing the material layer 112b is emitted, a concentration of the cleaning gas may be relatively higher, and thus, the material layer 112b may be relatively more removed, whereby a thickness of the material layer 112b may be relatively less.

In some embodiments, when an angle (see, e.g., δ of FIG. 4) between the fifth segment 144b and the sixth segment 144c of the second cleaning gas supply nozzle 144 is greater than 90 degrees, the cleaning gas may be emitted upward from the third height H3, and thus, as the third height H3 gets close to the second height H2, a thickness of the material layer 112b may increase progressively.

In some other embodiments, when the angle (see, e.g., δ of FIG. 4) between the fifth segment 144*b* and the sixth segment 144*c* of the second cleaning gas supply nozzle 144 is less than 90 degrees, the cleaning gas may be emitted downward from the third height H3, and thus, in some partial sections, as the third height H3 gets close to the first height H1, a thickness of the material layer 112*b* may increase progressively.

In the whole material layer 112*b*, a variation degree of a minimum thickness with respect to a maximum thickness may be equal to or less than about 10%, about 5%, or about 3%.

Figure 11:
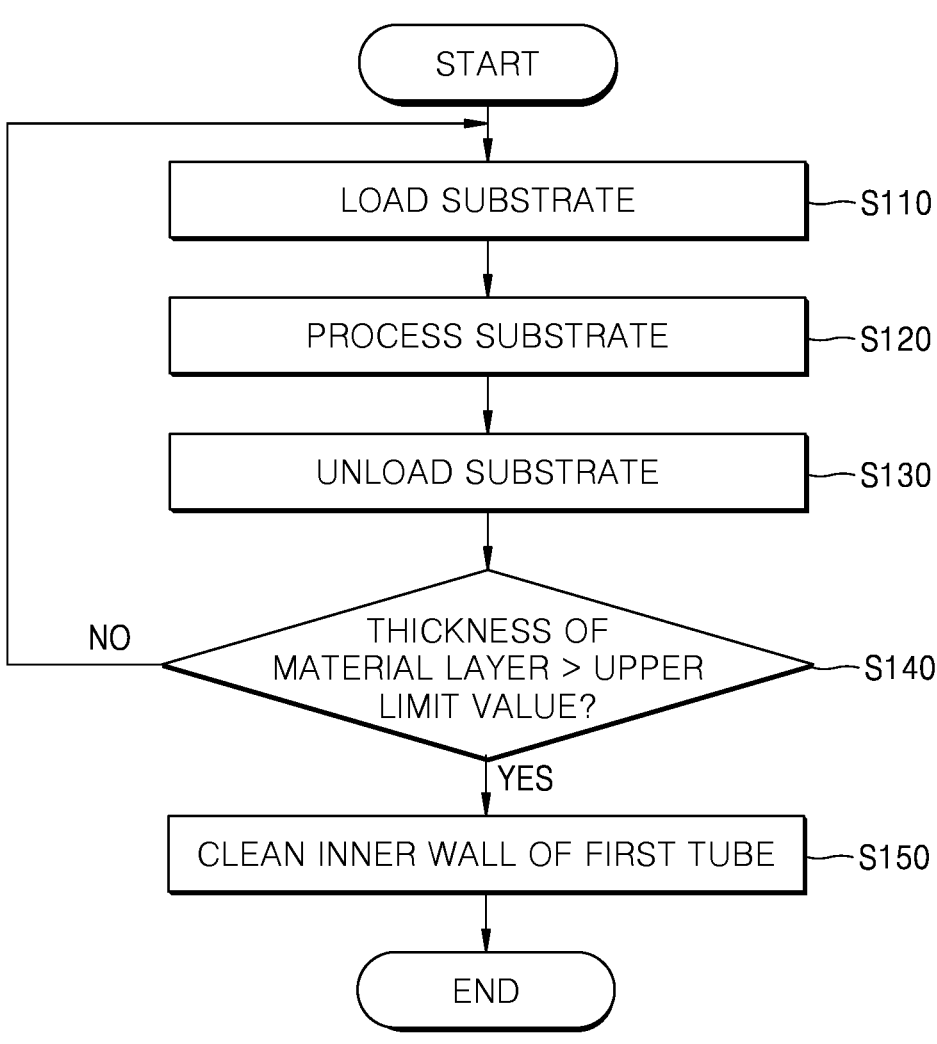
FIG. 11 is a flowchart illustrating a method of manufacturing a semiconductor device, according to an embodiment.

FIG. 11 is a flowchart illustrating a method of manufacturing a semiconductor device, according to an embodiment. The method may include using the apparatus 100 for manufacturing a semiconductor device disclosed hereinabove.

Referring to FIG. 11 in conjunction with FIG. 1, the substrates W may be loaded into the process chamber 110 in operation S110. The plurality of substrates W may be stacked on the boat 118, and the boat 118 may be vertically raised by the vertical driving unit 134 and may be loaded into the process chamber 110.

Subsequently, in operation S120, the substrates W may be processed. A process of processing the substrates W may be a deposition process, and for example, may be a process such as a physical vapor deposition process, a chemical vapor deposition process, or an atomic layer deposition process. At this time, a material layer may be deposited on the inner wall of the first tube 112.

Subsequently, in operation S130, processing-completed substrates W may be unloaded from the process chamber 110 to the outside. The unloading of the substrates W may be performed in the reverse order of the loading of the substrates W.

Subsequently, in operation S140, whether a thickness of the material layer deposited on the inner wall of the first tube 112 is greater than an upper limit value may be determined. For example, whether the thickness of the material layer deposited on the inner wall of the first tube 112 is greater than the upper limit value may be determined based on various methods.

In some embodiments, the thickness of the material layer on the inner wall of the first tube 112 may be directly measured, and whether the thickness of the material layer is greater than an upper limit value may be determined.

In other embodiments, the thickness of the material layer on the inner wall of the first tube 112 may be indirectly measured based on the number of completed batch processing operations previously performed on substrates in the process chamber 110. For example, various batch processing of substrates may be performed under a certain processing condition of the substrates processed in the process chamber 110, the thickness of the material layer deposited on the inner wall of the first tube 112 may be measured subsequently, and a correlation of a growth speed of the material layer based on the number of completed batch processing operations of substrates may be calculated subsequently. Subsequently, the number of completed batch processing operations may be counted by performing batch processing on substrates, thereby indirectly estimating the thickness of the material layer deposited on the inner wall of the first tube 112.

In addition, the thickness of the material layer deposited on the inner wall of the first tube 112 may be estimated or measured based on an arbitrary method known to those of ordinary skill in the art.

For example, when the thickness of the material layer deposited on the inner wall of the first tube 112 is not greater than the upper limit value, additional batch processing may be performed on substrates.

On the other hand, when the thickness of the material layer deposited on the inner wall of the first tube 112 is greater than the upper limit value, by cleaning the inner wall of the first tube 112, the material layer may be partially removed to have a certain thickness (for example, a thickness of about 2.5 μm to about 3 μm) in operation S150. The upper limit value may be a thickness of about 6 μm to about 6.5 μm. However, the upper limit value may be appropriately adjusted based on the kind of a deposited material layer and the kind of a cleaning gas.

Figure 12:
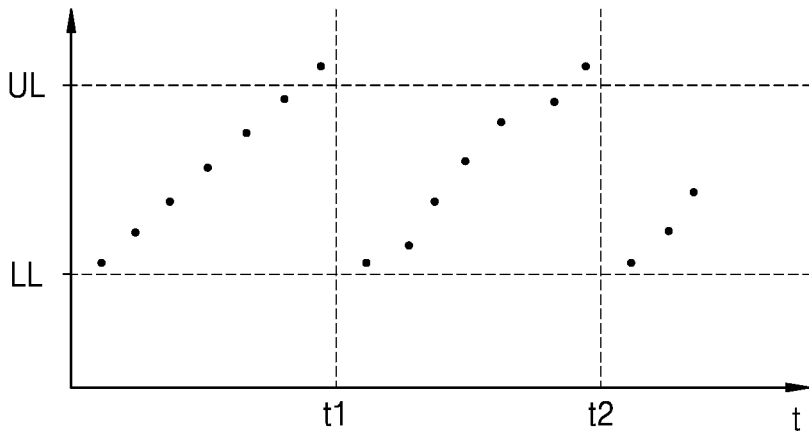
FIG. 12 is a graph illustrating a thickness variation of a material layer of a first tube caused by performing a method of manufacturing a semiconductor device, according to an embodiment.

FIG. 12 is a chart illustrating a thickness variation of a material layer of a first tube caused by performing a method of manufacturing a semiconductor device according to an embodiment.

Referring to FIG. 12, the abscissa axis may represent a time axis representing batch processing of substrates, and the ordinate axis may represent a thickness variation of the material layer deposited on the inner wall of the first tube 112. As batch processing of substrates is progressively performed, a thickness of the material layer deposited on the inner wall of the first tube 112 may increase. The thickness of the material layer may increase linearly.

The thickness of the material layer may be managed to be within a certain range. That is, the thickness of the material layer may not deviate from a range between an upper limit value UL and a lower limit value LL. For example, when the thickness of the material layer is greater than the upper limit value UL, a number of particles may occur, and due to this, the substrates may be polluted. On the other hand, when the thickness of the material layer is less than the lower limit value LL, a characteristic of the material layer deposited on the inner wall of the first tube 112 may be non-uniform, and due to this, a deposition environment for the substrates may be non-uniform.

When the thickness of the material layer becomes greater than the upper limit value UL (time t1) as batch processing of substrates is repeated, the material layer may be partially removed through operation S150 of cleaning the inner wall of the first tube 112 described above with reference to FIG. 11 by using the first cleaning gas supply nozzle 142 and/or the second cleaning gas supply nozzle 144 described above with reference to FIGS. 1 to 8. The material layer may be removed until the material layer is not thinned to be less than the lower limit value LL. For example, the material layer may be removed until the material layer thickness is less than the upper limit UL and greater than the lower limit LL. In some embodiments, the material layer may be removed until the material layer thickness is approximate to the lower limit LL. In other embodiments, the material layer may be removed until the material layer thickness falls within a certain thickness range. In some embodiments, the lower limit value LL may be set to about 2.5 μm to about 3 μm. In some embodiments, the upper limit value UL may be set to about 6 μm to about 6.5 μm.

Subsequently, batch processing of the substrates is repeated again, when the thickness of the material layer becomes greater than the upper limit value UL (time t2), the material layer may be partially removed until the thickness of the material layer is not thinned to be less than the lower limit value LL.

As described above, when a material layer is not completely removed and is intermittently managed to have a thickness (for example, about 2.5 μm to about 6.5 μm)

within a certain range, a deposition environment of a process chamber may be uniformly maintained, and based on management (i.e., emission of a cleaning gas) performed for a short time, particles may be prevented from being caused by the overgrowth of the material layer, thereby enhancing productivity and decreasing the manufacturing cost.

Hereinafter, the configuration and effect of the inventive concept will be described in more detail with reference to a detailed embodiment and comparative example, but the embodiment and the comparative example are for merely understanding the inventive concept clearly and do not limit the scope of the inventive concept.

Detailed Example Embodiment

In equipment for depositing polysilicon on a substrate, the first cleaning gas supply nozzle 142 (the second cleaning gas supply nozzle 144 is omitted) illustrated in FIG. 2 has been installed, and then, polysilicon deposited on an inner wall of a first tube has been partially etched by supplying a $CIF_3$ gas and an etch speed has been measured for each position.

In detail, a thickness of polysilicon deposited on the inner wall of the first tube has been measured at an uppermost portion, a center portion, and a lowermost portion of the inner wall of the first tube while performing 18 batches of a process of depositing polysilicon on the substrate, and, then, by supplying $CIF_3$ as a cleaning gas through the first cleaning gas supply nozzle 142, polysilicon deposited on the inner wall of the first tube has been partially removed. Subsequently, a thickness of residual polysilicon has been measured at the uppermost portion, the center portion, and the lowermost portion of the inner wall of the first tube again, and by calculating an etch speed, a result of the measurement has been listed in the following Table 1.

An internal density of a process chamber and an emission speed of a cleaning gas have been adjusted so that the cleaning gas emitted through the nozzle tip of the first cleaning gas supply nozzle 142 has a laminar flow (a Reynolds number of about 1,850).

Comparative Example

Except for that a cleaning gas supply nozzle where the third segment 142c of the first cleaning gas supply nozzle 142 is omitted is used as a cleaning gas supply nozzle, a thickness of polysilicon has been measured at the uppermost portion, the center portion, and the lowermost portion of the inner wall of the first tube again by using the same method as the embodiment, and by calculating an etch speed, a result of the measurement has been listed in the following Table 1.

TABLE 1

|  | Embodiment | Comparative example |
|---|---|---|
| Uppermost end (Å/min) | 20397 | 17320 |
| Center (Å/min) | 19805 | 13140 |
| Lowermost end (Å/min) | 19522.5 | 13060 |
| Deviation | 4% | 25% |

$$deviation(\%) = \left(1 - \frac{(minimum\ value)}{(maximum\ value)}\right) \times 100$$

As shown in Table 1, by using the cleaning gas supply nozzle of the embodiment, a difference between position-based etch speeds has been greatly reduced, and thus, a thickness of a polysilicon layer of the first tube may be managed to have about 2.5 μm to about 6.5 μm, thereby maintaining a uniform deposition environment and preventing particles from being caused by the overgrowth of the polysilicon layer.

By using the apparatus for manufacturing a semiconductor device according to the embodiments disclosed herein, a deposition environment may be uniform, thereby achieving uniform deposition and reducing the occurrence of particles.

While the inventive concept has been particularly shown and described with reference to embodiments thereof, it will be understood that various changes in form and details may be made therein without departing from the spirit and scope of the following claims.

What is claimed is:

1. An apparatus for manufacturing a semiconductor device, the apparatus comprising:

a boat configured to support a plurality of stacked substrates;

a first tube surrounding the boat in a lateral direction and having a cylindrical shape with an upper portion thereof being open;

a cleaning gas supply nozzle including a first segment extending from an outer portion of the first tube to an interior portion of the first tube between an inner concave surface of the interior sidewall of the first tube and an outer convex surface of the boat, a second segment extending in a lengthwise direction of the first tube from an end of the first segment, and a third segment extending in a direction differing from the extension direction of the second segment from an end of the second segment; and a process gas supply nozzle extending from the outer portion of the first tube to the interior portion of the first tube, wherein an end of the third segment includes a nozzle tip, wherein an extension direction of the third segment and the nozzle tip intersects the inner concave surface of the interior sidewall of the first tube without intersecting the center of the first tube, wherein the third segment is configured to orient to be parallel to a corresponding section of the inner concave surface of the interior sidewall of the first tube, wherein a Reynolds number of a cleaning gas discharged from the nozzle tip is 10 to 2,100 so that a laminar flow of the cleaning gas discharged from the nozzle tip is formed, wherein the nozzle tip is configured to be laterally spaced apart from the outer convex surface of the boat, and wherein the cleaning gas flows spirally along the inner concave surface of the interior sidewall of the first tube on the basis of a Coanda effect.

2. The apparatus of claim 1, wherein the extension direction of the third segment is oriented so that a cleaning gas emitted from the third segment flows along the inner concave surface of the interior sidewall of the first tube toward the upper portion thereof.

3. The apparatus of claim 2, wherein an angle between the second segment and the third segment is 60 degrees to 150 degrees.

4. The apparatus of claim 1, wherein an angle between the second segment and the third segment is adjustable.

5. The apparatus of claim 3, wherein the inner concave surface of the interior sidewall of the first tube includes a polysilicon layer deposited thereon, and an angle between the second segment and the third segment is 105 degrees to 120 degrees, for removing the polysilicon layer at least partially.

6. The apparatus of claim 5, wherein the third segment is configured to emit a cleaning gas for removing the polysilicon layer at least partially, to maintain a thickness of the polysilicon layer within a range from 2.5 μm to 6.5 μm.

7. The apparatus of claim 2, wherein an angle between the first segment and the second segment is 90 degrees.

8. The apparatus of claim 1, further comprising a second tube surrounding the first tube in a lateral direction and comprising a closed upper portion.

9. An apparatus for manufacturing a semiconductor device, the apparatus comprising:

a boat configured to support a plurality of substrates stacked at certain intervals;

a first tube surrounding the boat in a lateral direction and having a cylindrical shape with an upper portion thereof being open;

a second tube surrounding the first tube in a lateral direction and comprising a closed upper portion;

a manifold provided under the second tube;

a lid member provided under the manifold;

a rotation driving device configured to rotate the boat;

a vertical driving device configured to raise and lower the boat; and a first cleaning gas supply nozzle including a first segment passing through the manifold and extending in a horizontal direction from an outer portion of the second tube to an interior portion of the first tube, a second segment extending in a vertical direction between an inner concave surface of the interior sidewall of the first tube and an outer convex surface of the boat, and a third segment extending in a direction differing from the extension direction of the second segment from an end of the second segment; and a process gas supply nozzle extending from the outer portion of the first tube to the interior portion of the first tube, wherein an end of the third segment includes a first nozzle tip, wherein the first cleaning gas supply nozzle is configured to emit a cleaning gas at an oblique angle with respect to the vertical direction, wherein the third segment has a curved profile that is parallel to a corresponding section of an inner concave surface of the interior sidewall of the first tube, and is disposed adjacent to the inner concave surface of the interior sidewall of the first tube such that points along a length of the curved profile are equidistant from the corresponding section of the inner concave surface of the interior sidewall of the first tube, wherein the end of the second segment, from which the third segment extends, is positioned between the inner concave surface of the interior sidewall of the first tube and the outer convex surface of the boat, and at a level in the lengthwise direction that is lower than the top of the boat, wherein a Reynolds number of a cleaning gas discharged from the first nozzle tip is 10 to 2,100 so that a laminar flow of the cleaning gas discharged from the first nozzle tip is formed, wherein the first nozzle tip is configured to be laterally spaced from the outer convex surface of the boat, and wherein the cleaning gas flows spirally along the inner concave surface of the interior sidewall of the first tube on the basis of a Coanda effect.

10. The apparatus of claim 9, wherein the third segment extends from an end of the second segment at an angle of 60 degrees to 150 degrees with respect to the second segment.

11. The apparatus of claim 10, wherein the third segment is oriented to extend so that the cleaning gas emitted from the third segment flows along an inner concave surface of the interior sidewall of the first tube toward the upper portion thereof.

12. The apparatus of claim 10, wherein the third segment extends curvedly for a sub-length of a total length thereof.

13. The apparatus of claim 9, further comprising:

a second cleaning gas supply nozzle including a fourth segment extending in the horizontal direction from an outer portion of the second tube, a fifth segment extending in the vertical direction between the inner concave surface of the interior sidewall of the first tube and the outer convex surface of the boat, and a sixth segment extending in a direction differing from the extension direction of the fifth segment from an end of the fifth segment, wherein an end of the sixth segment includes a second nozzle tip, and wherein, in a sideview, a height of the second nozzle tip is higher than a height of the first nozzle tip when measured from the lowermost portion of the first tube.

14. The apparatus of claim 9, wherein an outer surface of the first tube is spaced apart from an inner surface of the second tube.

15. The apparatus of claim 9, further comprising:

a material layer deposited on an inner wall of the first tube and having a thickness within a first thickness range, wherein the first cleaning gas supply nozzle is configured to partially remove the material layer and maintain the thickness of the material layer within the first thickness range, and wherein the first cleaning gas supply nozzle is configured to emit a cleaning gas to flow spirally along the inner wall of the first tube on the basis of a Coanda effect.

16. The apparatus of claim 15, wherein the first thickness range is 2.5 μm to 6.5 μm.

17. The apparatus of claim 15, wherein the cleaning gas is a halogen-containing etching gas.

18. The apparatus of claim 1, wherein the end of the second segment, from which the third segment extends, is positioned at a level in the lengthwise direction that is lower than the top of the boat.

19. The apparatus of claim 13, wherein the end of the fifth segment, from which the sixth segment extends, is positioned at a level in the lengthwise direction that is higher than the end of the second segment and lower than the top of the boat.

20. An apparatus for manufacturing a semiconductor device, the apparatus comprising:

a boat configured to support a plurality of stacked substrates;

a first tube surrounding the boat in a lateral direction and having a cylindrical shape with an upper portion thereof being open;

a cleaning gas supply nozzle including a first segment extending from an outer portion of the first tube to an interior portion of the first tube between an inner concave surface of the interior sidewall of the first tube and an outer convex surface of the boat, a second segment extending in a lengthwise direction of the first tube from an end of the first segment, and a third segment extending in a direction differing from the extension direction of the second segment from an end of the second segment; and a process gas supply nozzle extending from the outer portion of the first tube to the interior portion of the first tube, wherein an end of the third segment includes a nozzle tip, wherein the third segment has a curved profile that is parallel to a corresponding section of an inner concave surface of the interior sidewall of the first tube, and is disposed adjacent to the inner concave surface of the interior sidewall of the first tube such that points along a length of the curved profile are equidistant from the corresponding section of the inner concave surface of the interior sidewall of the first tube, wherein the end of the second segment, from which the third segment extends, is positioned between the inner concave surface of the interior sidewall of the first tube and the outer convex surface of the boat, and at a level in the lengthwise direction that is lower than the top of the boat, wherein the nozzle tip is configured to be laterally spaced apart from the outer convex surface of the boat, and wherein a cleaning gas discharged from the cleaning gas supply nozzle flows spirally along the inner concave surface of the interior sidewall of the first tube on the basis of a Coanda effect.

\* \* \* \* \*